(12) United States Patent
Ohsaki

(10) Patent No.: US 8,013,980 B2
(45) Date of Patent: *Sep. 6, 2011

(54) EXPOSURE APPARATUS EQUIPPED WITH INTERFEROMETER AND EXPOSURE APPARATUS USING THE SAME

(75) Inventor: Yoshinori Ohsaki, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 607 days.

This patent is subject to a terminal disclaimer.

(21) Appl. No.: 11/956,747

(22) Filed: Dec. 14, 2007

(65) Prior Publication Data

US 2008/0111980 A1    May 15, 2008

Related U.S. Application Data

(63) Continuation of application No. 11/219,508, filed on Sep. 1, 2005, now Pat. No. 7,330,237.

(30) Foreign Application Priority Data

Sep. 1, 2004  (JP) .................................. 2004-253948

(51) Int. Cl.
*G03B 27/54* (2006.01)
*G03B 27/68* (2006.01)
*G03B 27/42* (2006.01)

(52) U.S. Cl. .............................. 355/67; 355/52; 355/53
(58) Field of Classification Search .................. 355/52, 355/53, 55, 67–71; 356/399–401, 515; 430/5, 430/20, 30; 250/548
See application file for complete search history.

(56) References Cited

U.S. PATENT DOCUMENTS

| | | | |
|---|---|---|---|
| 3,950,103 A | 4/1976 | Schmidt-Weinmar | |
| 5,402,224 A | 3/1995 | Hirukawa et al. | |
| 5,473,435 A | 12/1995 | Masuyuki et al. | |
| 5,953,124 A | 9/1999 | Deck | |
| 6,151,122 A * | 11/2000 | Taniguchi et al. | 356/399 |
| 6,271,923 B1 | 8/2001 | Hill | |
| 6,344,898 B1 | 2/2002 | Gemma et al. | |
| 6,456,377 B1 | 9/2002 | Suzuki et al. | |
| 6,522,386 B1 * | 2/2003 | Nishi | 355/52 |
| 6,743,554 B2 * | 6/2004 | Nakao | 430/5 |
| 7,242,475 B2 * | 7/2007 | Baselmans et al. | 356/399 |
| 7,330,237 B2 * | 2/2008 | Ohsaki | 355/52 |
| 2001/0028462 A1 | 10/2001 | Ichihara et al. | |
| 2002/0041372 A1 * | 4/2002 | Gardner et al. | 356/71 |
| 2002/0191195 A1 | 12/2002 | Ichihara et al. | |
| 2003/0048439 A1 | 3/2003 | Yoshida et al. | |
| 2003/0095247 A1 | 5/2003 | Nakao | |
| 2003/0197865 A1 | 10/2003 | Shiode | |

FOREIGN PATENT DOCUMENTS

JP        57-064139       4/1982
(Continued)

*Primary Examiner* — Hung Henry Nguyen
(74) *Attorney, Agent, or Firm* — Rossi, Kimms & McDowell LLP

(57) ABSTRACT

An exposure apparatus includes a projection optical system for projecting an exposure pattern, onto an object to be exposed, and a measuring apparatus for measuring, as an interference fringe, optical performance of the projection optical system, wherein the measuring apparatus includes an optical element having opposing first and second surfaces, wherein the first surface has a first measurement pattern, and the second surface has a second measurement pattern and is closer to the projection optical system than the first measurement pattern, and wherein the measuring apparatus introduces light into the projection optical system via first and second measurement patterns.

10 Claims, 15 Drawing Sheets

FOREIGN PATENT DOCUMENTS

| | | |
|---|---|---|
| JP | 2000-097666 | 4/2000 |
| JP | 2000-146705 | 5/2000 |
| JP | 2002-198303 A | 7/2002 |
| JP | 2003-075990 A | 3/2003 |
| JP | 2003-156832 A | 5/2003 |
| JP | 2003-399216 | 11/2003 |
| JP | 2005-156506 | 6/2005 |
| WO | 03/088329 A1 | 10/2003 |

* cited by examiner

EXPOSURE APPARATUS EQUIPPED WITH INTERFEROMETER AND EXPOSURE APPARATUS USING THE SAME

This application is a continuation of prior U.S. patent application Ser. No. 11/219,508, filed Sep. 1, 2005, now U.S. Pat. No. 7,330,237, to which priority under 35 U.S.C. §120 is claimed. This application claims a benefit of priority based on Japanese Patent Application No. 2004-253948, filed on Sep. 1, 2004, which is hereby incorporated by reference herein in its entirety as if fully set forth herein.

BACKGROUND OF THE INVENTION

The present invention relates generally to an exposure apparatus and method, and more particularly to an exposure apparatus equipped with an interferometer, and an exposure method using the exposure apparatus. The interferometer measures a wavefront aberration of a projection optical system for transferring a mask pattern onto an object to be exposed.

A projection exposure apparatus is conventionally used to transfer a mask or reticle pattern onto an object to be exposed in manufacturing devices, such as semiconductor devices, image pickup devices, display devices and magnetic heads, in the photolithography process. This exposure apparatus should transfer the mask pattern onto the object precisely at a predetermined magnification. For this purpose, it is important to use a projection optical system having excellent imaging performance and reduced aberration. In particular, due to the recent demands for finer processing to the semiconductor devices, a transferred pattern is more sensitive to the aberration of the optical system. Therefore, there is a need to measure the optical performance, such as a wavefront aberration, of the projection optical system with high precision. In addition, the simple, quick and inexpensive measurements are important for improved productivity and economical efficiency.

One known method for measuring the optical performance of the projection optical system actually exposes a mask pattern onto a wafer, and observes and inspects the resist image using a scanning electron microscope ("SEM") or another means. This method, however, has a problem in a long inspection time due to the exposure and development, difficult SEM operations, and bad inspection reproducibility due to errors caused by resist applications and developments. Accordingly, as a solution for these problems, various measuring apparatuses have conventionally been proposed, such as a point diffraction interferometer ("PDI") that has a pinhole used to form an ideal spherical wavefront, a shearing interferometer, such as a lateral shearing interferometer ("LSI"), or a Talbo interferometer that utilizes the shearing interferometry. More recently, a line diffraction interferometry ("LDI") has been proposed which has a slit to form an ideal cylindrical wavefront or an ideal elliptical wavefront. See, for example, Japanese Patent Applications, Publication Nos. 57-64139, 2000-146705, and 2000-97666.

Nevertheless, the conventional entire system that includes the measuring apparatus and exposure apparatus separately is large and structurally complex, causing the increased cost and the long measuring time. Accordingly, applicant has already proposed an exposure apparatus equipped with an interferometer in Japanese Patent Application, Publication No. 2005-156506 (corresponding to U.S. patent application Ser. No. 11/167,112). In addition, the wavefront aberration of the projection optical system can be calculated by taking the phase information out of the interference fringe, for example, by using a fringe scan method. See for example, Optical Shop Testing second edition, Daniel Malacara, Wiley-Interscience Publication 1992, Chapter 14. "Phase Shifting Interferometry."

In general, the highly coherent exposure light precludes accurate pattern transfer onto a wafer, because the lights that pass through the mask pattern interfere with each other. Therefore, the exposure apparatus usually makes the exposure light incoherent using the illumination optical system. However, in an exposure apparatus equipped with an interferometer, the interferometer should utilize the low coherent exposure light, thereby deteriorating the precision of the wavefront aberration. Accordingly, the instant inventors have studied an application of the light from an alignment scope for an alignment between a mask and a wafer. However, the inventors have discovered that the light from the alignment scope is also made incoherent to some extent so as to reduce speckles, and poses a similar problem. In addition, the fringe scan method needs to change a phase of the light and thus a driving system for this purpose provided in the exposure apparatus causes a complicated structure and increased cost. There is a need to measure the wavefront aberration using a simple structure. In some instances, there is a demand to eliminate an uneven light intensity distribution and to improve the measuring precision of the wavefront aberration even at cost of the coherence.

BRIEF SUMMARY OF THE INVENTION

The present invention is directed to an exposure apparatus equipped with an interferometer for measuring aberrations with a simple structure and/or high precision, and an exposure apparatus utilizing the exposure apparatus.

An exposure apparatus according to one aspect of the present invention includes a projection optical system for projecting an exposure pattern, onto an object to be exposed, and a measuring apparatus for measuring, as an interference fringe, optical performance of the projection optical system, wherein the measuring apparatus includes an optical element having opposing first and second surfaces, wherein the first surface has a first measurement pattern, and the second surface has a second measurement pattern and is closer to the projection optical system than the first measurement pattern, and wherein the measuring apparatus introduces light into the projection optical system via first and second measurement patterns.

An exposure method according to another aspect of the present invention includes the steps of calculating optical performance of a projection optical system using the above exposure apparatus, adjusting the projection optical system based on the optical performance of the projection optical system, which is calculated by the calculating step, and exposing an object using the exposure apparatus that includes the projection optical system adjusted by the adjusting step.

A mask according to still another aspect of the present invention used for a measuring apparatus in an exposure apparatus that includes a projection optical system for projecting an exposure pattern onto an object to be exposed, and the measuring apparatus for measuring, as an interference fringe, optical performance of the projection optical system includes a pair of measurement patterns on front and back surfaces of the mask, the measuring apparatus introducing light into the projection optical system through the measurement patterns.

A device manufacturing method according to still another aspect of the present invention includes the steps of exposing an object using the above exposure apparatus, and developing the object exposed. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

First Embodiment

Figure 1:
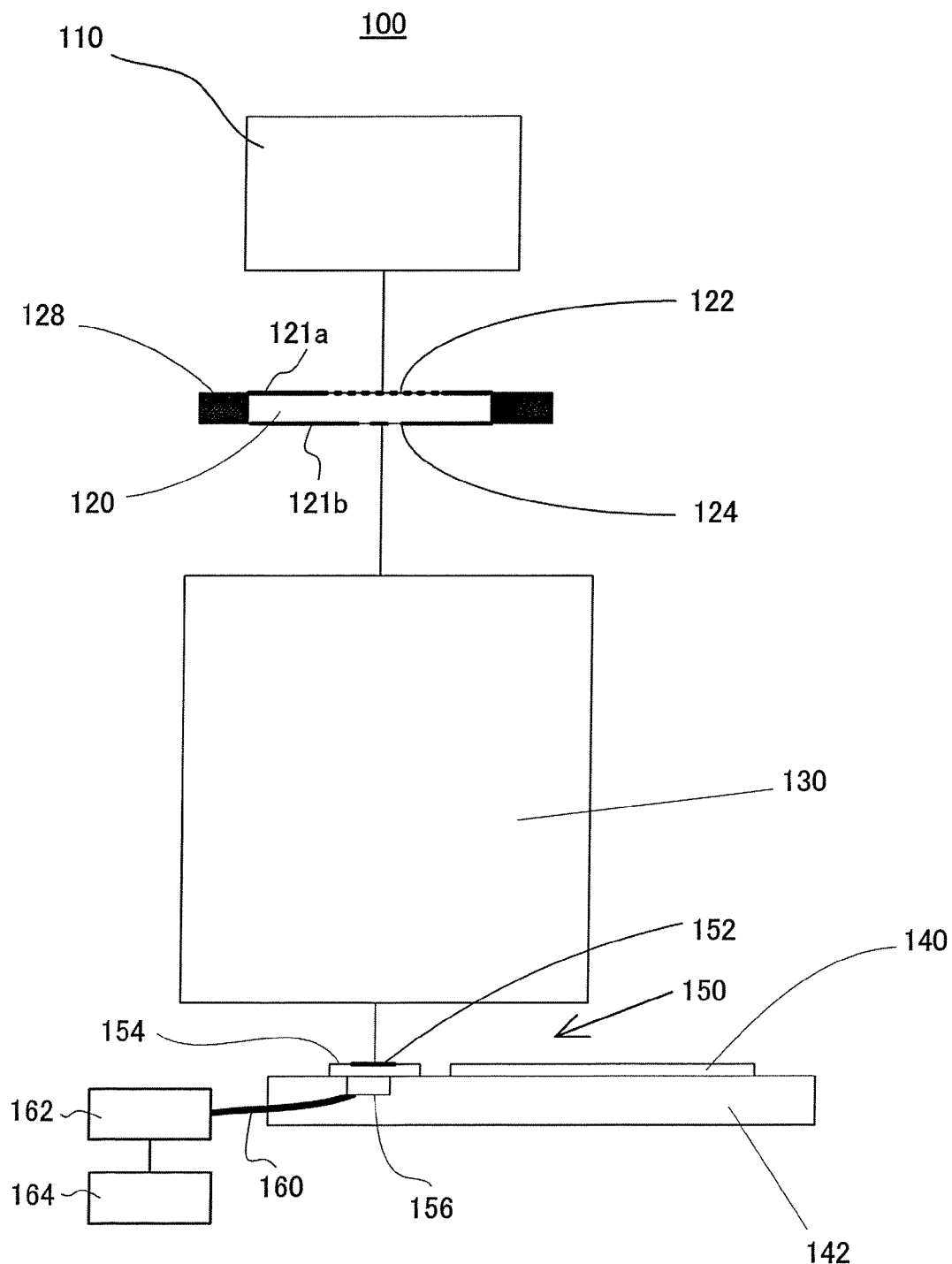
FIG. 1 is a schematic block diagram of an exposure apparatus according to a first embodiment of the present invention.

Referring now to the accompanying drawings, a description will be given of an exposure apparatus 100 according to a first embodiment of the present invention. Here, FIG. 1 is a schematic block diagram of the exposure apparatus 100. The exposure apparatus 100 is a projection exposure apparatus to expose a circuit pattern of an exposure mask for exposure use (not shown) onto an object as a plate 140, e.g. in a step-and-repeat or a step-and-scan manner. This embodiment discusses a step-and-scan exposure apparatus (which is also called "a scanner") as an example. The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

The exposure apparatus 100 includes an illumination apparatus 110, a projection optical system 130, a plate 140, and a measuring apparatus or an interferometer 150. In this specification, a reference numeral generalizes a reference numeral with a capital unless otherwise specified.

The illumination apparatus 110 illuminates an exposure mask (not shown) for exposure use that has a circuit pattern to be transferred, and a measurement mask 120 for measurement use, and includes a light source section and an illumination optical system. The light source section may use as a light source an ArF excimer laser with a wavelength of approximately 193 nm, and a KrF excimer laser with a wavelength of approximately 248 nm. A kind of laser is not limited to excimer laser, and the number of laser units is not limited. A light source applicable to the light source unit is not limited to a laser. One or more lamps may be used, such as a mercury lamp and a xenon lamp.

The illumination optical system is an optical system that illuminates the exposure mask and the measurement mask 120, and includes a beam shaping section, an incoherently turning section, an optical integrator, a stop, a lens system, etc. The beam shaping section turns a parallel beam from the laser light source into a desired beam shape. The incoherently turning section turns a coherent laser beam into an incoherent one. The optical integrator serves to make the illumination light uniform, and turns the light into incoherent one. The optical integrator includes, for example, a fly-eye lens having a two-dimensional array of lenses, and an optical rod. The stop defines an effective light source shape arranged near the optical integrator. The lens system includes a masking blade and a condenser lens, and images the light from the stop onto the mask surface.

The exposure mask or reticle is made, for example, of quartz, and has a circuit pattern or image to be transferred. It is supported and driven by a mask or reticle stage 128. The diffracted light from the exposure mask is projected onto the plate 140 via the projection optical system 130. The exposure mask and the plate 140 are located in an optically conjugate relationship. Since the exposure apparatus 100 is a scanner, the exposure mask and the plate 140 are scanned at a speed ratio of the reduction ratio and the mask pattern is transferred to the plate 140. If it is a step-and-repeat exposure apparatus (referred to as a "stepper"), the exposure mask and the plate 140 are made stationary still during exposure.

The projection optical system 130 may use a dioptric optical system solely including a plurality of lens elements, a catadioptric optical system including a plurality of lens elements and at least one mirror, and a catoptric optical system of a full mirror type, and so on. The measuring apparatus 150 measures the optical performance, such as a wavefront aberration, of the projection optical system 130.

The plate 140 is an object to be exposed, such as, a wafer and a liquid crystal display substrate. A photoresist is applied to the plate 140. The plate 140 is mounted on a stage 142 via a chuck (not shown). The stage 142 supports the plate 140 and part of the measuring apparatus 150. The stage 142 may use any structures known in the art. A detailed description of its structure and operation is omitted. The stage 142 may use, for example, a linear motor to move the plate 140 in the XY directions. The exposure mask and plate 140 are, for example, scanned synchronously, and the stage 142 and mask stage 128 are driven at a constant speed ratio.

The measuring apparatus 150 introduces the light through a pattern 124 to the projection optical system 130, and receives the light through a pattern 152 from the projection optical system 130. The measuring apparatus 150 measures, as an interference fringe, the optical performance of the projection optical system 130, such as a wavefront aberration. The measuring apparatus 150 includes a measurement mask (or a first measurement mask) 120 mounted on the stage 128, a reference plate (or a second measurement mask) 154 mounted on the stage 142, an image capturing element 156, a communication cable 160, a controller 162, and a memory 164. In this embodiment, the interferometer that constitutes the measuring apparatus 150 uses an LDI with a slit to form an ideal cylindrical wavefront and an ideal elliptical wavefront. However, the interferometer may use a PDI that has a pinhole to form an ideal spherical wavefront, and may apply an LSI that uses a shearing interferometry.

The mask 120 has opposing front and back surfaces 121$a$ and 121$b$: The front surface 121$a$ has a measurement pattern 122 for measurement use, and the back surface 121$b$ has a measurement pattern 124 for measurement use. The surface 121$b$ is closer to the projection optical system 130 than the surface 121$a$, as shown in FIG. 1. The measuring apparatus 150 introduces the light to the projection optical system 130 via the measurement patterns 122 and 124.

Figure 2:
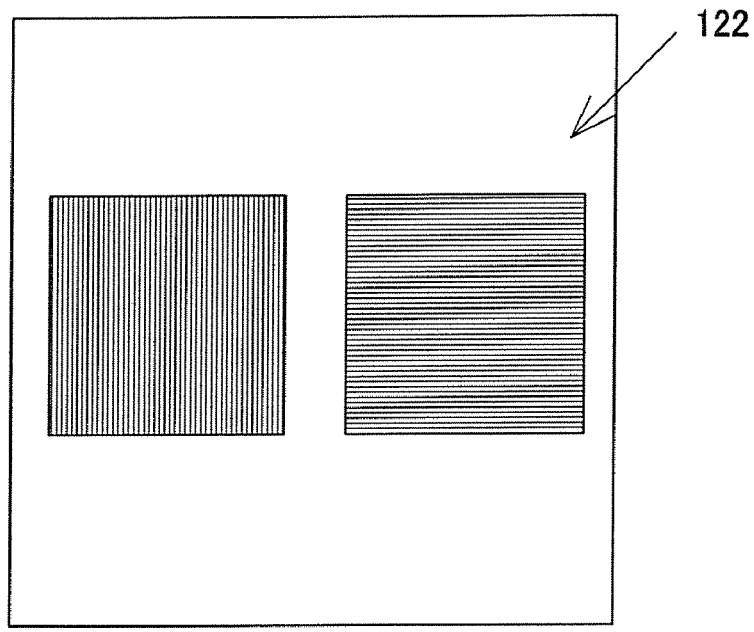
FIG. 2 is a schematic plane view of a pattern on one surface of the mask for the exposure apparatus shown in FIG. 1.
Figure 3:
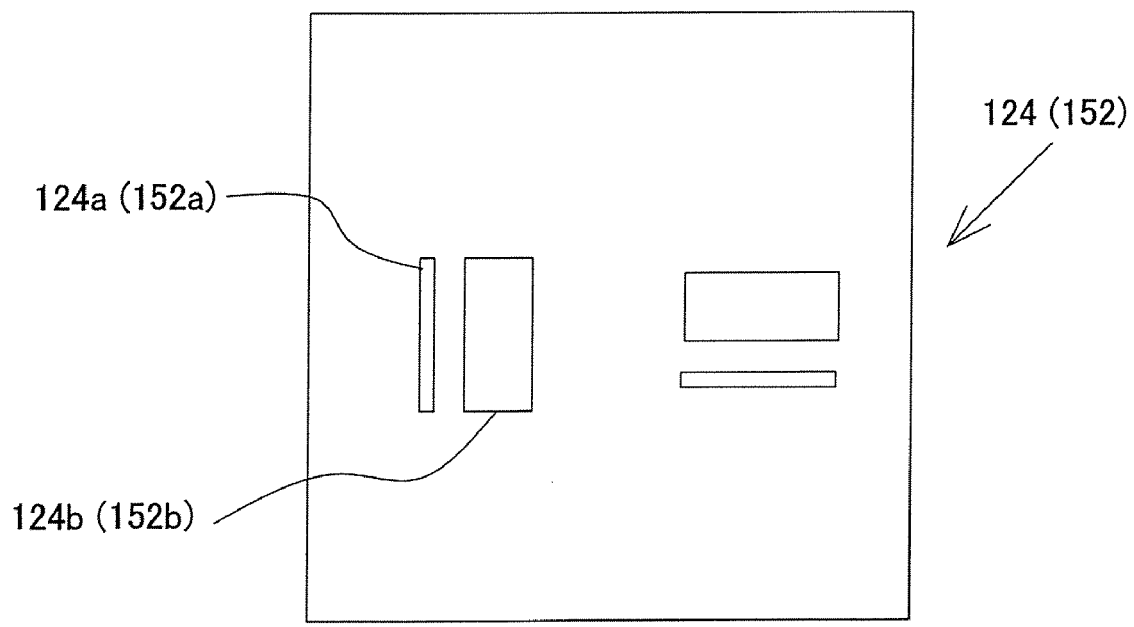
FIG. 3 is a schematic plane view of a pattern of the other surface of the mask for the exposure apparatus shown in FIG. 1.

Characteristically, the mask 120 provides the surface 121$a$ with a diffraction grating to form the pattern 122, and maintains interference fringes having visibility enough high to measure the aberration of the projection optical system 130. FIG. 2 shows an example of the pattern 122, and FIG. 3 shows an example of the pattern 124. The pattern 152 has a pair of narrow and wide slits, and FIG. 3 is used to illustrate both the patterns 124 and 152. The visibility V is defined as follows, where $I_{max}$ is a maximum light intensity, and $I_{min}$ is a minimum light intensity.

$$V=(I_{max}-I_{min})/(I_{max}+I_{min}) \quad [\text{EQUATION 1}]$$

The short-side length or width of each of the slits 124$a$ and 152$a$ shown in FIG. 3 has is smaller than a diffraction limit, and provides an ideal elliptic wavefront with respect to the slit's short side. On the other hand, the width of the rectangular opening 152$b$ is determined by the special frequency f of the projection optical system 130 to be measured. The common length L to the slit and the rectangular opening should be smaller than the so-called isoplanatic area in which the aberration of the projection optical system 130 is considered identical, although the longer length L is preferred in terms of the light intensity.

The image capturing element 156 is a photoelectric sensor, such as a CCD, and detects an interference fringe between two lights from the slit 124$a$ or 152$a$ and the window 124$b$ or 154$b$. The cable 160 connects the image capturing element 156 and the controller 162 to each other so that they can communicate with each other. The controller 162 obtains phase information from an output from the image capturing element 156. Moreover, the controller 162 controls each component in the exposure apparatus 100. The memory 164 stores a measuring method, a processing method for obtaining the phase distribution from the output of the image capturing element 156, phase distribution obtained by the controller 162, a control method conducted by the controller 162 and other data.

Figure 4:
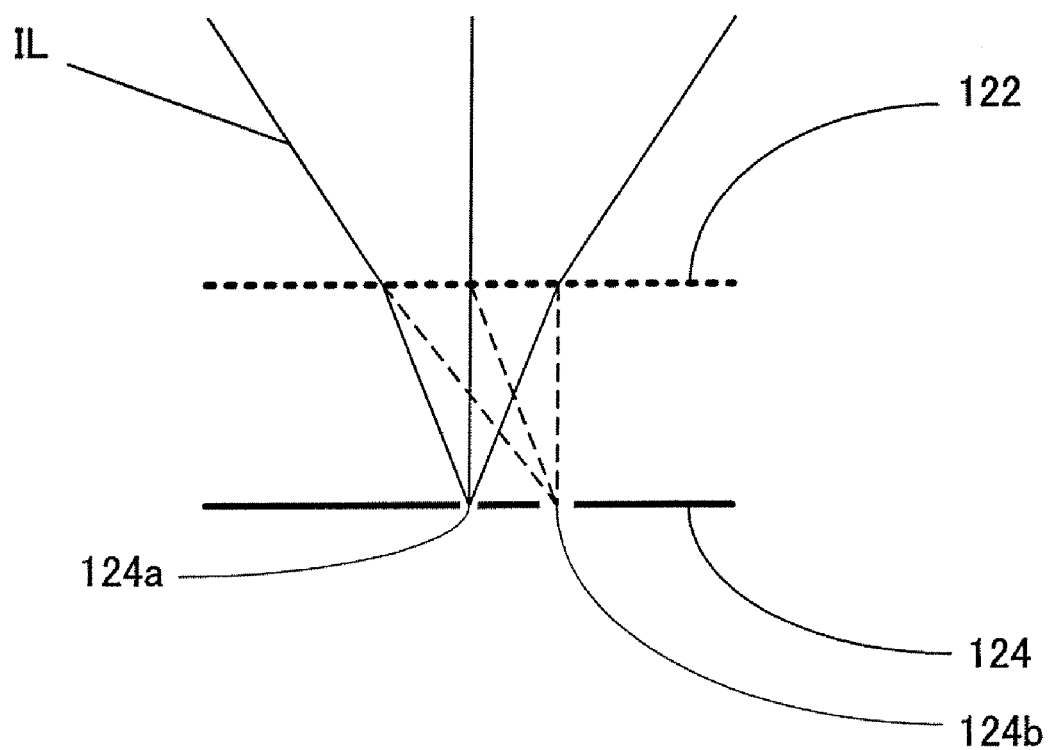
FIG. 4 is a view for explaining a structure and operation of the mask that has the patterns shown in FIGS. 2 and 3.

Referring now to FIG. 4, a description will be given of an operation when these patterns 122, 124 and 152 are used. The slits 124 and the slit 122 (or the diffraction grating) are arranged parallel to each other. The light that passes the diffraction grating is divided into plural orders of lights. Among them, the 0-th order light is incident upon the pattern 124$a$, and one of $\pm 1^{st}$ order diffracted lights is incident upon the pattern 124$b$. Each of the lights incident upon two patterns is regarded as the light from the diffraction grating 122 as a light source, and has special coherence. The images of these two patterns are projected on the pattern 152 shown in FIG. 1 on a wafer-side reference plate 154 through the projection optical system 130.

The image of the narrow slit 124$a$ in the pattern 124 is projected onto the wide slit 152$b$ in the pattern 152, while the image of the wide slit 124$b$ in the pattern 124 is projected onto the narrow slit 152$a$ in the pattern 152. The light from the slit 152$b$ (which is influenced by the aberration of the projection optical system 130) and the light from the slit 152$a$ (which has no aberration in the slit's short-side direction) are made interfere with each other. The lights emitted from the slits 124$a$ and 124$b$ have much higher coherence than the conventional apparatus, and the image capturing element 156 can receive an interference fringe having higher visibility than the conventional one. Consequently, the wavefront aberration of the projection optical system 130 in the slit's short-side direction can be measured with precision.

The image capturing element 156 takes images of the projection optical system 130 whose centers are offset by an interval between the two slits 152$a$ and 152$b$, and detects an interference fringe in a common area of them. The wavefront aberration of the projection optical system in a single direction, such as the x direction, can be calculated from the phase distribution derived from the interference fringe. Plural captured interference fringes are sent from the image capturing element 156 to the controller 162 via the cable 160, and the controller 162 acquires the phase distribution. The controller 162 may user, for example, the electronic Moiré method in obtaining the phase distribution. The interference fringe has a carrier fringe in this embodiment. In the processing, the controller 162 multiplies, by the captured interference fringe, the carrier fringe that has been prepared by the controller 162 or previously produced and stored in the memory 164. Use of the electronic Moiré method is advantageous in terms of time because the phase information can be taken out of a single interference fringe.

Use of slits that extend in orthogonal direction to the slits 124$a$, 124$b$, 152$a$ and 152$b$ provides the measurements of the wavefront aberration of the projection optical system 130 in orthogonal directions or the x and y directions. As discussed above, this embodiment provides the diffraction grating pattern 122 to the surface 121$a$ of the mask 120 at the illumination optical system. This configuration generates an interference fringe having high visibility and enables the wavefront aberration of the projection optical system to be measured with high precision without adding a new optical system.

Second Embodiment

Figure 5A:
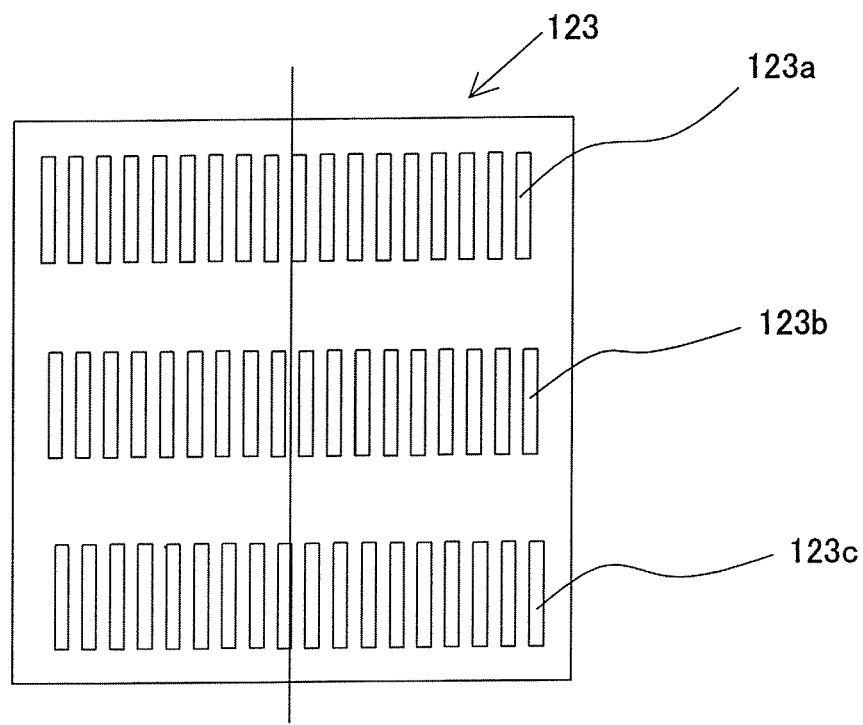
FIGS. 5A and 5B are schematic plane views of the patterns shown in FIGS. 2 and 3 for an exposure apparatus according to a second embodiment of the present invention.

A description will now be given of a second embodiment of the present invention. The first embodiment has a problem in difficulty of using a fringe scan method that is a highly precise phase measuring method due to the fixed arrangement between the diffraction grating 122 and the pattern 124 on the mask 120 surface. Accordingly, in order to make the fringe scan method available, this embodiment arranges the diffraction grating 123 on the mask surface 121a as shown in FIG. 5A. In addition, the mask surface 121b has three sets of slits 125 having the same X image point, and arranges them at three different points in the X direction. The diffraction grating 123 is arranged at a different position in the X direction from the three slits 125 having the same X image point. For example, where P is a pitch of the diffraction grating 123, the diffraction gratings 123b and 123c are located at different positions in the X direction from the diffraction grating 123a by P/4 and P/2, respectively.

In the fringe scan using the diffraction grating 123 and the slit 125, the mask stage 128 is moved so that the slits 125a and 125b are located within the exposure area of the projection optical system 130. Among the lights from the diffraction grating 123a, the 0-th order light is introduced into one slit 125a and the 1st order diffracted light is introduced into the other slit 125b. After two diffracted lights pass these slits and then the projection optical system 130 and the slit 152, these lights are made interfere with each other to form a first interference fringe.

Next, the mask stage 128 is driven so that the slits 125c and 125d are located at the same image point of the projection optical system 130, similar to the slits 125a and 125b. Similar to the light emitted from the diffraction grating 123b, the 0-th order light is introduced into one slit 125c, and the 1st order diffracted light is introduced into the other slit 125d. After two diffracted lights pass these slits and then the projection optical system 130 and the slit 152, these lights are made interfere with each other to form a second interference fringe.

Next, the mask stage 128 is further driven so that the slits 125e and 125f are located at the same image point of the projection optical system 130, similar to the slits 125a-d. Similar to the light emitted from the diffraction grating 123c, the 0-th order light is introduced into one slit 125e, and the 1st order diffracted light is introduced into the other slit 125f. After two diffracted lights pass these slits and then the projection optical system 130 and the slit 152, these lights are made interfere with each other to form a third interference fringe.

The first to third interference fringes have the same aberrations because all of them are derived from the light that passes the same image point of the projection optical system 130. On the other hand, the diffraction gratings 123a to 123c are different in position from the slit 125. Therefore, the phase of the 1st order light changes whereas the phase of the 0-th order light does not change among the diffracted lights emitted from the diffraction gratings 123a to 123c. As a result, the first to third interference fringes are three types of phase-modulated interference fringes as if only the diffraction grating 123 is driven by P/4 and P/2 where P is a pitch of the diffraction grating. Therefore, the fringe scan is available without driving the diffraction grating 123.

Figure 6A:
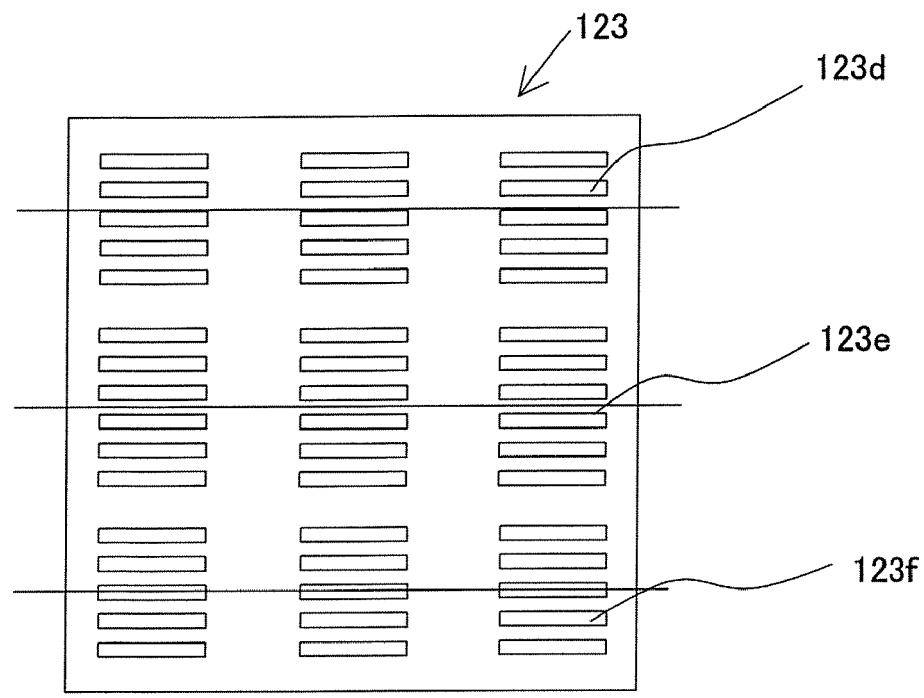
FIGS. 6A and 6B are schematic plane views of patterns orthogonal to those shown in FIGS. 5A and 5B for an exposure apparatus according to a second embodiment of the present invention.
Figure 6B:
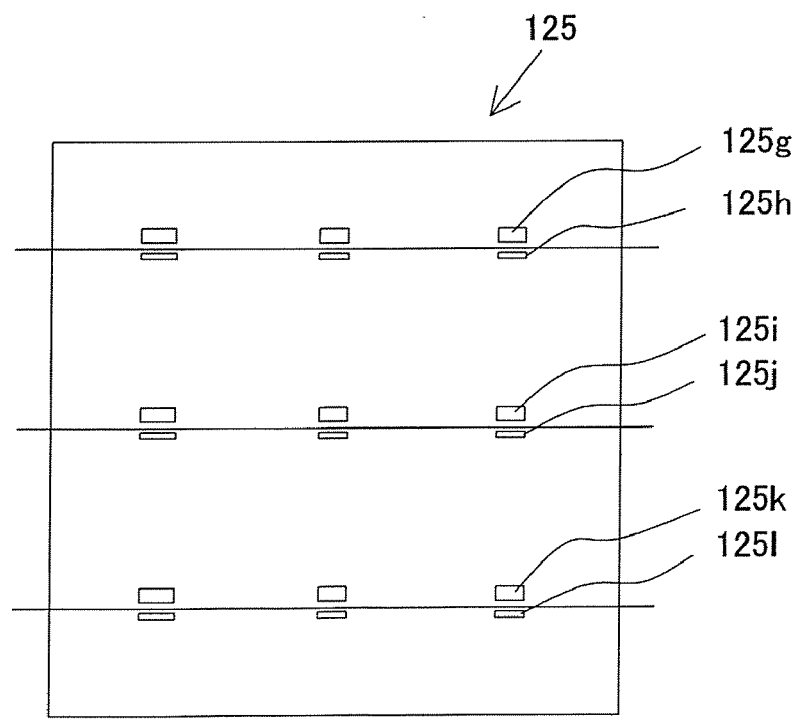

In particular, since the scanning exposure apparatus can precisely drive the mask stage 128 over the entire mask area in the Y direction, the fringe scan is feasible without requiring a new driving system. As a result, a phase can be extracted from these interference fringes with high precision, and the wavefront aberration of the projection optical system can be calculated. While this embodiment executes the fringe scan by using the three sets of diffraction gratings 123a to 123c and the slit 125, the phase may be varied in a finer pitch by using a combination of more members. The fringe scan in the Y direction is available by driving the mask stage 128 and using plural sets of diffraction gratings 123 (or 123d to 123f) and the slit 125 (125g to 125l) as shown in FIGS. 6A and 6B. A single mask may have both the X and Y patterns, or use pinholes instead of the slits.

Figure 7A:
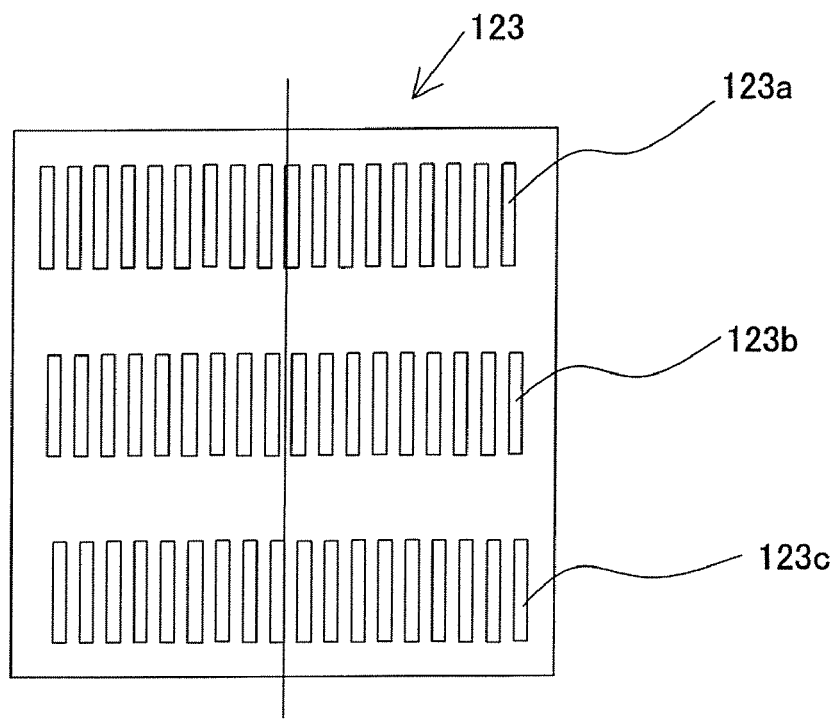
FIGS. 7A and 7B are schematic plane views of a variation of the patterns shown in FIGS. 5A and 5B applicable to the exposure apparatus according to the second embodiment of the present invention.
Figure 7B:
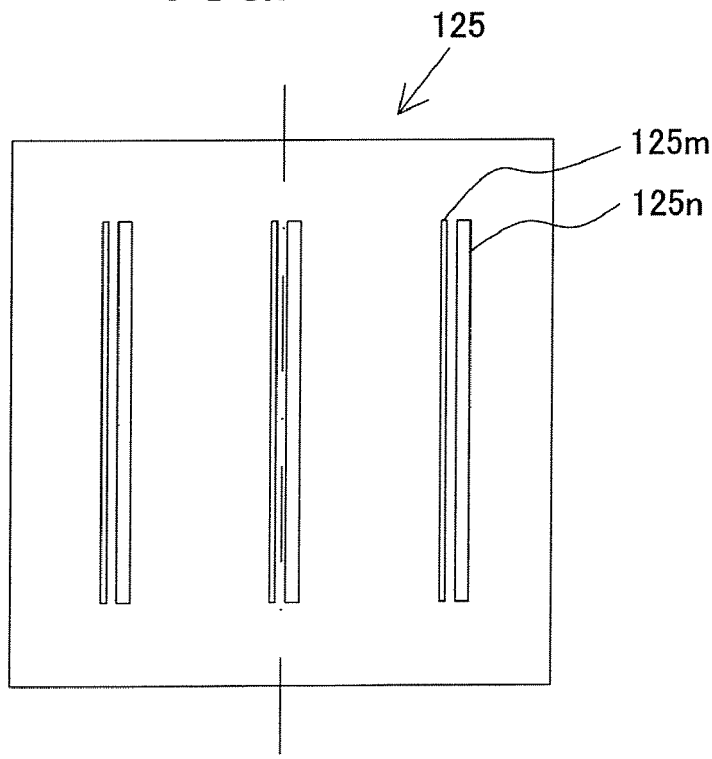

Moreover, plural diffraction gratings 123 shown in FIG. 7A similar to that shown in FIG. 5A in association with some pairs of long slits 125m and 125n shown in FIG. 7B provide similar effects, when part of the slits (only in effective areas of the diffraction gratings) are illuminated.

Third Embodiment

Figure 8:
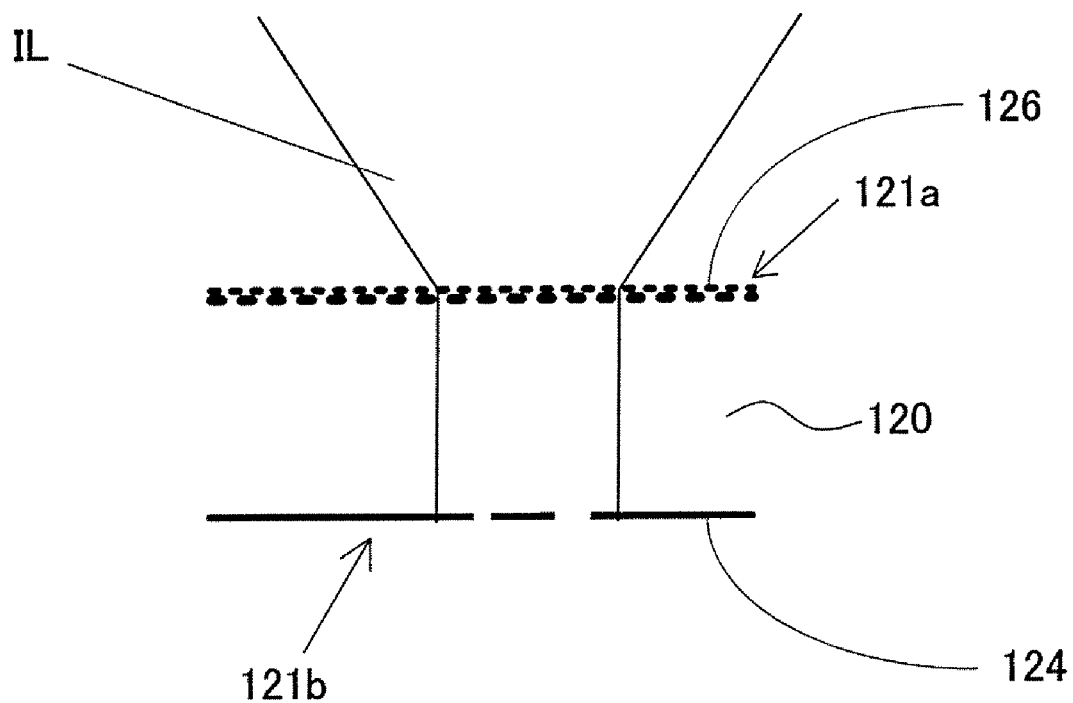
FIG. 8 is a view for explaining a structure and operation of a mask used for the exposure apparatus according to a third embodiment of the present invention.

Referring now to FIG. 8, a description will be given of a third embodiment of the present invention. As illustrated, this embodiment provides the mask surface 121a with a computer-generated hologram ("CGH") 126 instead of the diffraction grating. The CGH 126 turns the NA and phase of the illumination light that illuminates the slit and pinhole on the mask 120 to desired states, improving the coherence. For example, as shown in FIG. 8, approximately collimated illumination light is used to illuminate the pinhole and slit on the mask with σ=0. This configuration improves the coherence and provides an interference fringe having high visibility.

Fourth Embodiment

Figure 9:
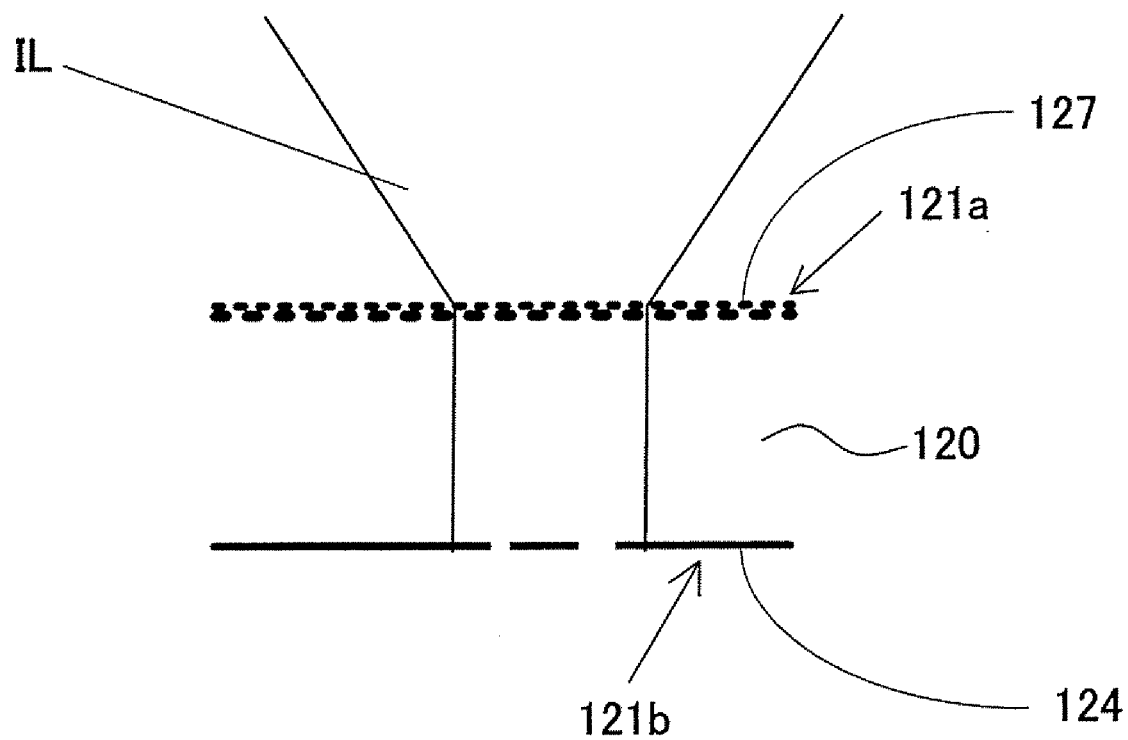
FIG. 9 is a view for explaining a structure and operation of a mask used for the exposure apparatus according to a fourth embodiment of the present invention.

A description will now be given of a fourth embodiment of the present invention with reference to FIG. 9. As illustrated, this embodiment provides the mask surface 121a with a diffuser plate or surface 127 instead of the diffraction grating. The diffuser surface 127 reduces influence of a periodic intensity distribution resulting from the optical system having an array of optical elements, like a fly-eye lens, in the illumination optical system. If the periodic intensity distribution exists due to the fly-eye lens etc., the periodic distribution are superimposed on the interference fringes and affect the calculation of the wavefront aberration. However, the diffuser surface eliminates this periodic intensity distribution, and enables the wavefront aberration to be calculated with precision from the interference fringe.

Fifth Embodiment

A description will now be given of an exposure apparatus 100A according to a fifth embodiment of the present invention. Since the first to fourth embodiments provide the mask surface 121a with a pattern, any pattern on the backside of the exposure mask would negatively influence the exposure of the device pattern on the mask surface 121b. In other words, the method that uses the mask needs an exchange of the mask between the exposure time and the wavefront aberration measurement time. In an attempt to detect aberrational changes etc. of the projection optical system 130 due to the exposure heat, the wavefront aberration should expect the cooling influence of the lenses after the exposure stops and then the mask is exchanged. This expectation lowers the precision of the measurement.

Figure 10:
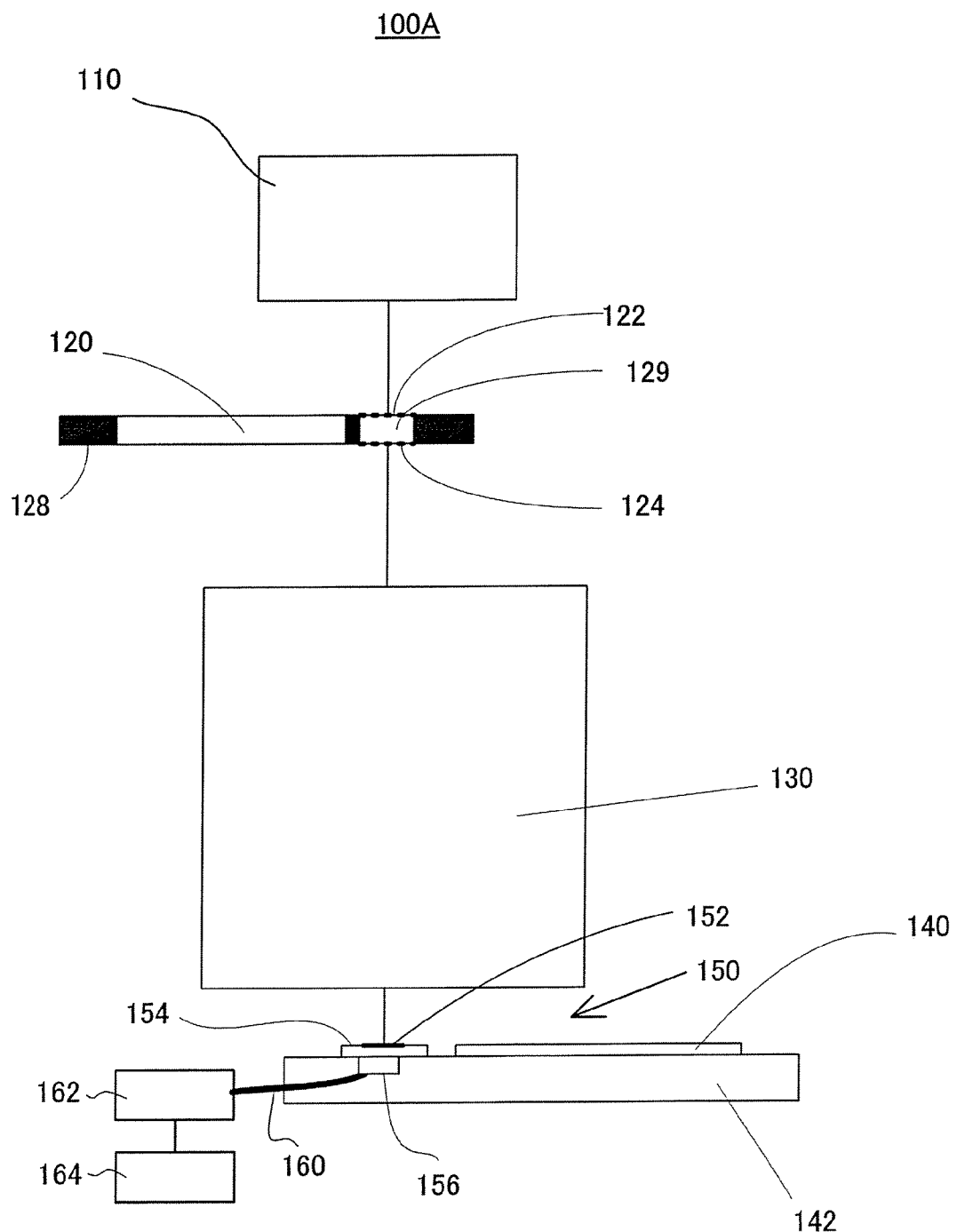
FIG. 10 is a schematic block diagram of an exposure apparatus according to a fifth embodiment of the present invention.

Accordingly, this embodiment characteristically provides, as shown in FIG. 10, a mask-side reference plate 129, which is arranged at a position equivalent to the mask 120, with one of the functions of the first to fourth embodiments. Use of the mask-side reference plate 129 would provide a measurement of the wavefront aberration without exchanging the mask 120. For example, in measuring the aberrational changes of the projection optical system 130 due to the exposure heat, stopping the exposure to the wafer is stopped, the mask stage 128 and the wafer stage 142 are driven, and the pattern for use of the measurement of the wavefront aberration is inserted into the optical path of the illumination light. The mask stage 128 and the wafer stage 142 can be quickly driven, whereby the exposure is switched to the wavefront aberration measurement within 1 second. In addition, the exposure apparatus originally installs the mask-side reference plate 129, and conveniently provides an aberration measurement at any timing. While this embodiment uses the mask-side reference plate 129, two masks 120 may be mounted on the mask stage 128 and two masks may be switched and alternately used between the exposure and the aberration measurement.

Sixth Embodiment

Figure 11:
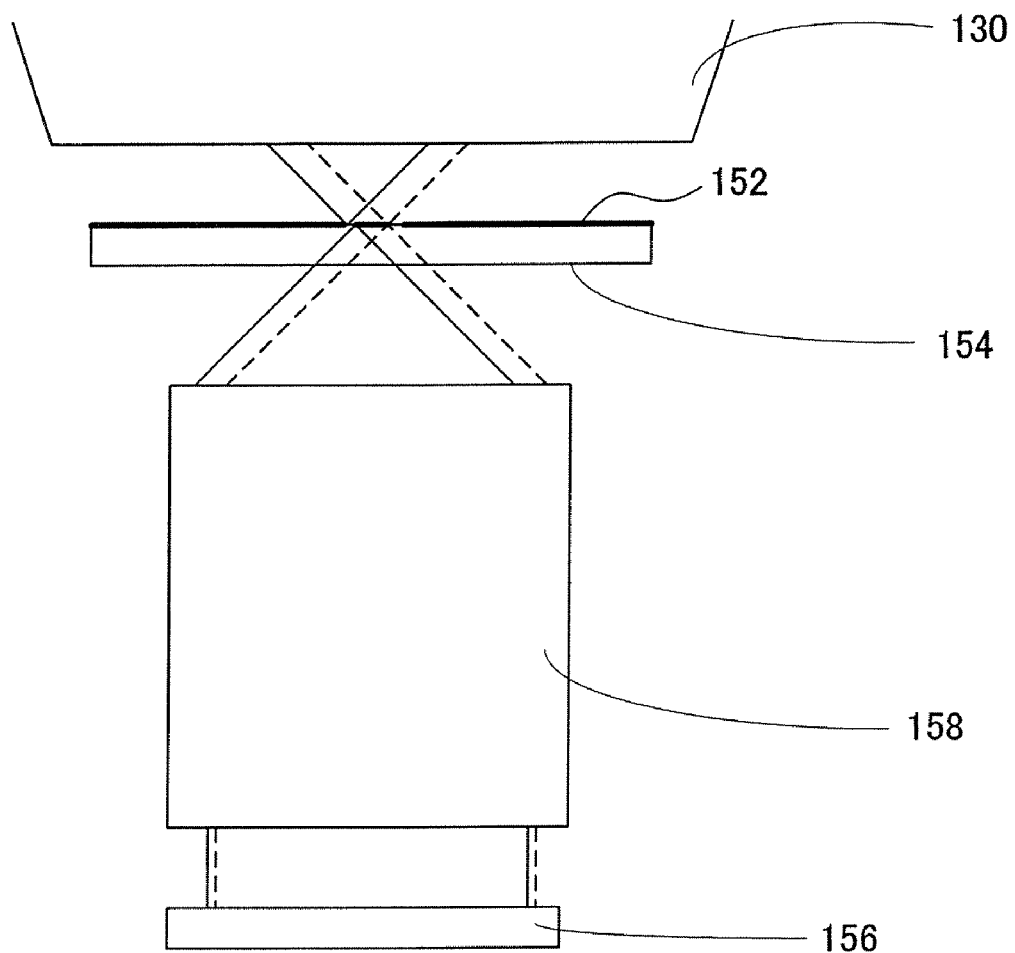
FIG. 11 is a schematic block diagram of a measuring apparatus used for the exposure apparatus according to a sixth embodiment of the present invention.

Referring now to FIG. 11, a description will be given of a sixth embodiment of the present invention. This embodiment provides a Fourier transformation lens 158 having positive power between the wafer-side reference plate 154 and the image capturing element 156. Two lights exited from two slits or pinholes on the wafer-side reference plate 154 are divergent lights, and the first to fifth embodiments obtain the interference fringe by arranging the image capturing element 156 in the divergent light. Therefore, the obtained interference fringe is not that at the position conjugate with the pupil in the projection optical system 130 but that at a defocus position. In order to calculate the aberration of the projection optical system 130, phase distribution at the pupil position is calculated based on the phase distribution at the defocus position. In particular, as the NA of the projection optical system 130 increases, the miscalculation increases and the calculation time extends in calculating its wavefront aberration. This embodiment arranges, on the other hand, the Fourier transformation optical system between the wafer-side reference plate 154 and the optical sensor so that the patterned surface of the wafer-side reference plate 154 (at the side of the projection optical system 130) and the image capturing element 156 have a relationship of an image and a pupil. The interference fringe obtained by the image capturing element 156 is conjugate with the pupil in the projection optical system 130, and eliminates the above calculation, improving the precision and shortening the calculation time.

Seventh Embodiment

Figure 12:
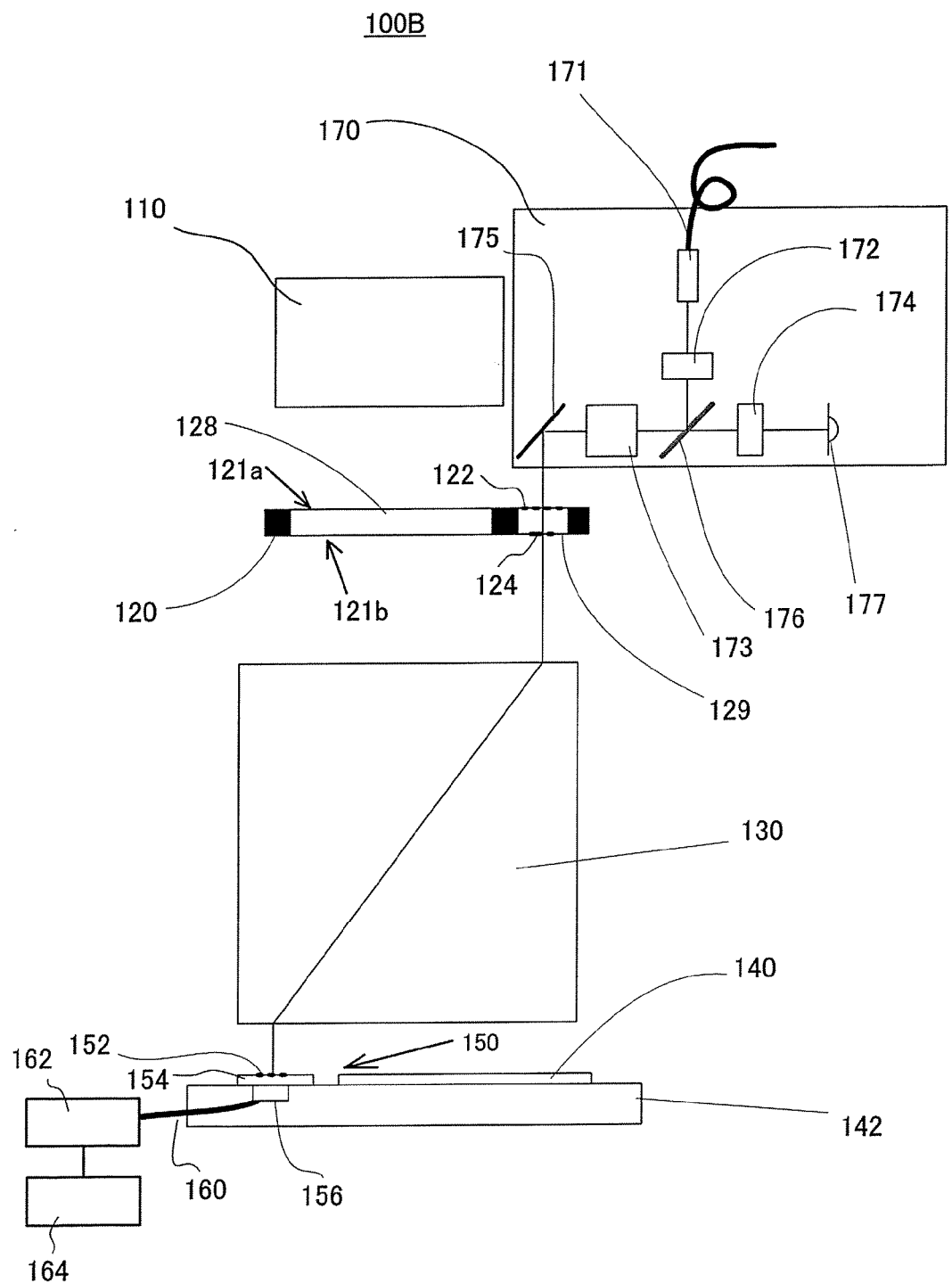
FIG. 12 is a schematic block diagram of an exposure apparatus according to a seventh embodiment of the present invention.

Referring now to FIG. 12, a description will be given of an exposure apparatus 100B of a seventh embodiment of the present invention. This embodiment characteristically uses an optical system 170 different from the illumination optical system 110 for exposure use. This embodiment utilizes the optical system or alignment scope 170 for an alignment mark on the mask 120 or the mask-side reference plate 129 and an alignment mark on the wafer or the wafer-side reference plate, to illuminate the patterns 122 and 124 for aberration measurement on the front and back surfaces of the mask-side reference plate 129. Use of the optical system different from that for exposure use would suit the illumination condition of the illumination optical system 110, such as the NA and light intensity of the illumination optical system and light intensity distribution on the pupil, to the aberration measurement irrespective of the specification of the illumination optical system for exposure use.

For example, while exposure often uses a modified illumination, such as a dipole illumination, a quadrupole illumination, and an annular illumination, the aberration measurement preferably uses a normal circular pupil rather than the modified illumination and a highly coherent illumination condition with small σ. Therefore, when the measurement of the wavefront aberration is necessary during exposure, the illumination condition may need to be changed.

On the other hand, the illumination condition for alignment having small σ would enhance the contrast of the alignment mark and provide precise measurement. Thus, the wavefront aberration can be measured without changing the illumination condition of the illumination optical system for exposure use even during exposure, if the illumination condition for the alignment optical system is set to small σ and the aberration is measured with the alignment optical system. In addition, even when the illumination condition for alignment is different from the illumination condition for aberration measurement, the wavefront aberration can be measured with a suitable illumination condition without lowering the throughput, if the illumination condition for alignment is switched to the illumination condition for aberration measurement during exposure after the alignment is completed.

While this embodiment discusses the alignment optical system, another optical system, such as an optical system dedicated for aberration measurement.

Eighth Embodiment

Figure 5B:
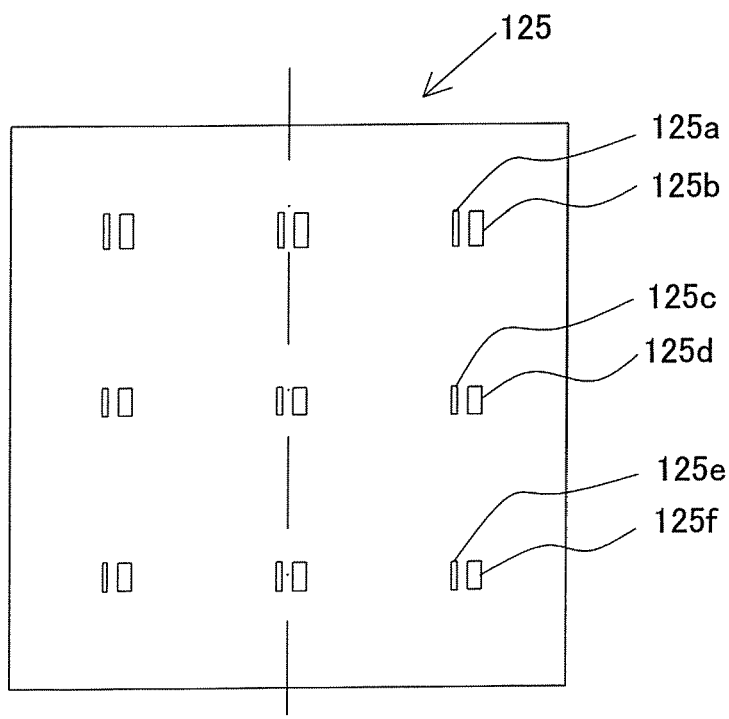
Figure 13:
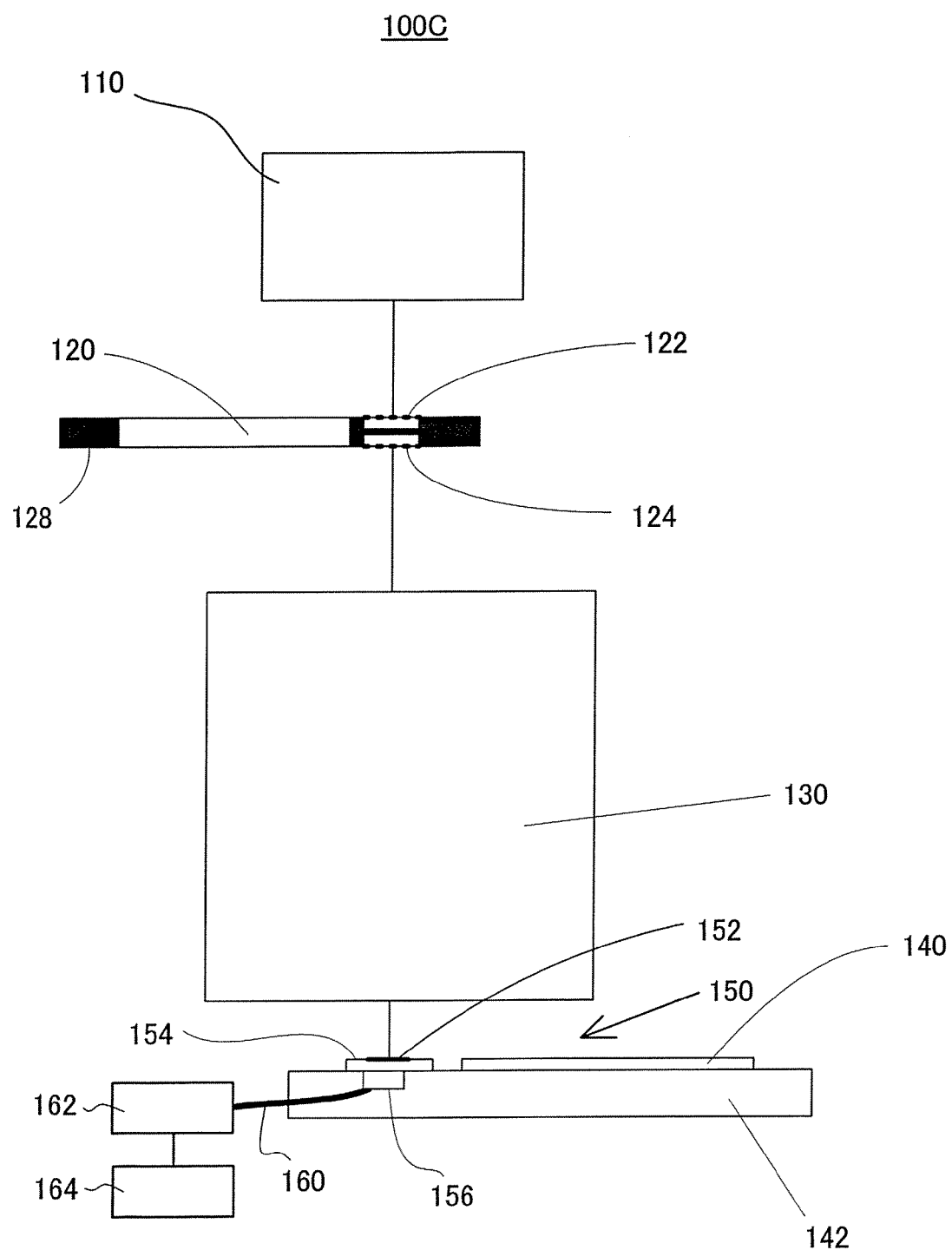
FIG. 13 is a schematic block diagram of an exposure apparatus according to an eighth embodiment of the present invention.
Figure 14:
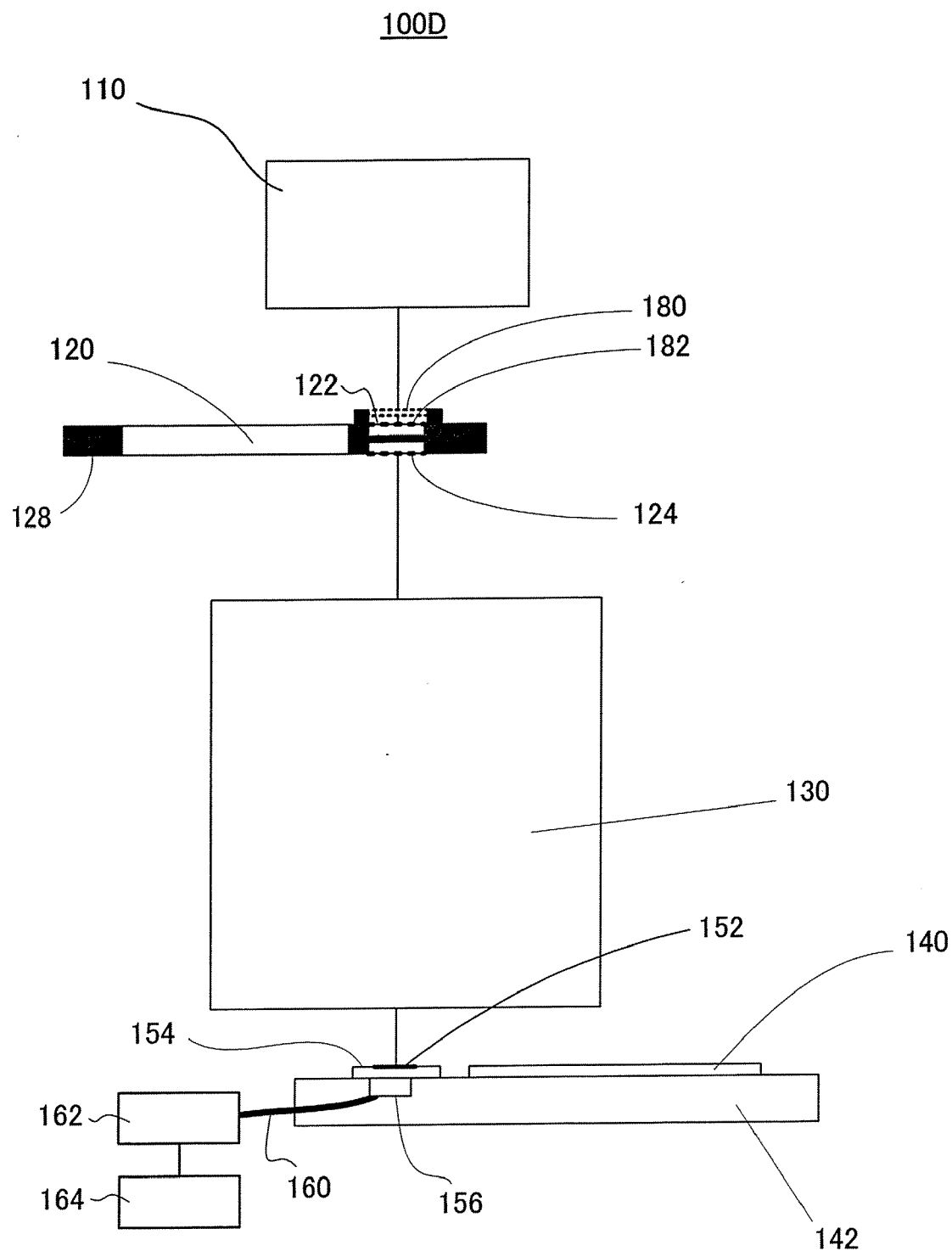
FIG. 14 is a schematic block diagram of a variation of the exposure apparatus according to the eighth embodiment of the present invention.

Referring now to FIG. 13, a description will be given of an exposure apparatus 100C. In this embodiment characteristically, the mask-side reference plate 129 and the mask 120 have two or more optical members. For example, as shown in FIG. 13, the diffraction grating 123 shown in FIG. 5A is formed on a single transparent substrate, and the slit 125 and pinhole etc. are formed on the other substrate as shown in FIG. 5B. The mask stage 128 supports them so that their positional relationship does not change. This structure provides similar effects to those in the above embodiments without using expensive double-sided patterned mask. In addition, two or more different patterns may be used simultaneously, such as a diffuser plate 180 and a diffraction grating 182, as in an exposure apparatus 100D shown in FIG. 14. These optical members may be directly adhered to each other, or held via a mechanical component so that their positional relationship does not change.

Ninth Embodiment

A description will now be given of an aberration correction method according to one embodiment of the present invention. The exposure apparatus 100 allows plural optical elements (not shown) in the projection optical system 130 to move in the optical-axis direction and/or a direction orthogonal to the optical-axis direction. The exposure apparatus 100 further includes a driving system (not shown) for aberrational adjustments, and can drive one or more optical elements based on obtained aberrational information. The exposure apparatus 100 can correct or optimize one or more aberrations of the projection optical system 130, in particular Zeidel's classification of aberrations. The means for adjusting the aberration of the projection optical system 130 can use a movable mirror (when the projection optical system is includes a mirror) in addition to a movable lens. Furthermore, the exposure apparatus 100 may use various known aberration adjusting systems, such an inclinable parallel plate, a pressure-controllable space, and a surface correction using an actuator.

Tenth Embodiment

Figure 15:
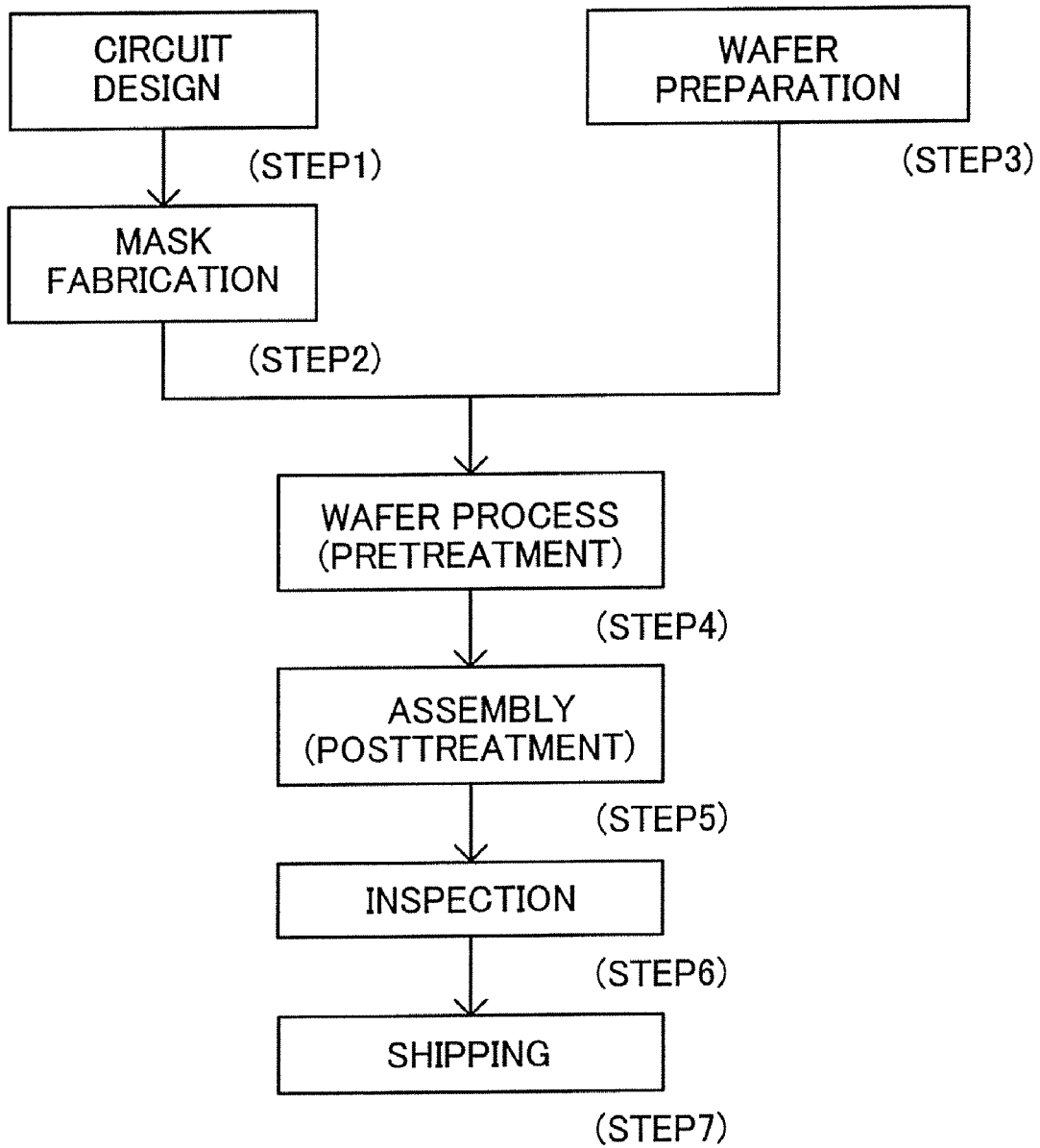
FIG. 15 is a flowchart for explaining a method for fabricating devices (semiconductor chips such as ICs, LSIs, and the like, LCDs, CCDs, etc.).

A description will now be given of an embodiment of a device manufacturing method using the projection exposure apparatus 100. FIG. 15 is a flowchart for explaining a fabrication of devices (i.e., semiconductor chips such as IC and LSI, LCDs, CCDs, etc.). Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g. dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 16:
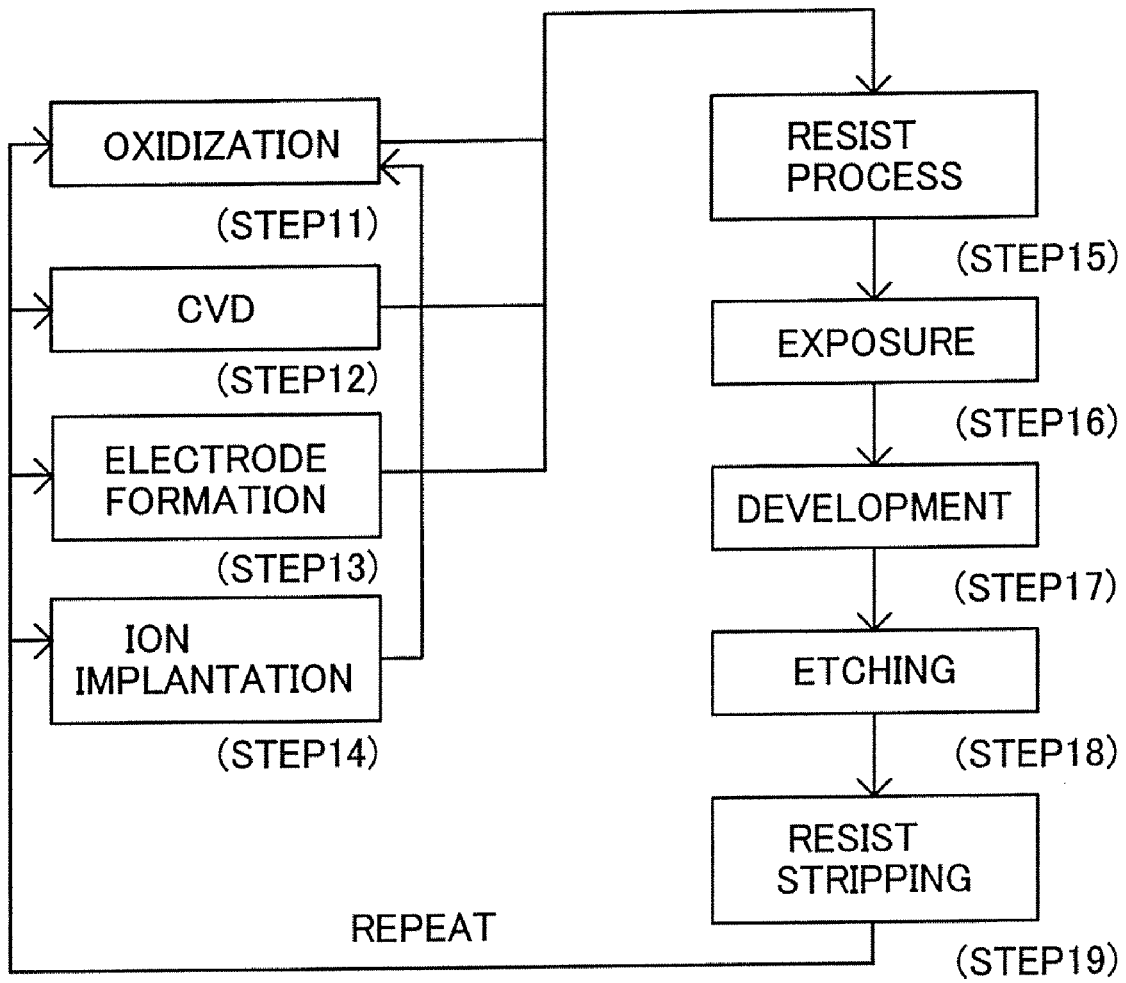
FIG. 16 is a detailed flowchart for Step 4 of wafer process shown in FIG. 15.

FIG. 16 is a detailed flowchart of the wafer process in Step 4 in FIG. 15. Step 111 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose an exposure mask's pattern onto the plate 140. Step 17 (development) develops the exposed plate 140. Step 18 (etching) etches parts other than a developed resist image. Step 19 (resist stripping) removes disused resist after etching. These steps are repeated, and multilayer circuit patterns are formed on the plate 140. The manufacturing method of this embodiment can quickly and easily obtain the imaging performance of the projection optical system 130 without lowering the exposure throughput, and utilize the projection optical system 130 whose wavefront aberration has been highly precisely corrected. Therefore, the manufacture semiconductor devices with good productivity and economical efficiency (such as semiconductor devices, LCD devices, image pickup devices (e.g. CCDs), and thin film magnetic heads) which have been difficult to manufacture. The projection optical system 130 having corrected wavefront aberration provides an alignment for the wafer stage with high precision. Thus, the device manufacturing method that uses the exposure apparatus 100, and its resultant (intermediate and final) products also constitute one aspect of the present invention.

What is claimed is:

1. An exposure apparatus comprising:
    a projection optical system for projecting an exposure pattern, onto an object to be exposed; and
    a measuring apparatus for measuring an interference fringe as an optical performance of said projection optical system,
    wherein said measuring apparatus includes an optical element having opposing first and second surfaces, wherein the first surface has a diffraction grating and the second surface has a plurality of openings and is closer to said projection optical system than the diffraction grating, and
    wherein said measuring apparatus measures the interference fringe being generated by lights of diffracted lights from the diffraction grating, each of which transmits on of a plurality of openings and said projection optical system.

2. An exposure apparatus according to claim 1, further comprising a mask stage for holding an exposure mask which has the exposure pattern, wherein said optical element is fixed onto said mask stage.

3. An exposure apparatus according to claim 1, wherein each of the diffracted lights having different orders transmits one of the plurality of openings.

4. An exposure apparatus according to claim 1, wherein the measurement apparatus further includes:
    a reference plate mounted on a wafer stage that supports the object to be exposed, said reference plate having a third measurement pattern to which lights from the first and second measurement patterns are introduced; and
    a detector for detecting the light from the third measurement pattern.

5. An exposure apparatus according to claim 4, wherein said measuring apparatus further includes an optical system that has positive power and is arranged between the third measurement pattern and said detector.

6. An exposure apparatus according to claim 5, wherein said optical system that has the positive power substantially maintains a Fourier transformation relationship between a pattern surface of the third measurement pattern and the detector.

7. An exposure apparatus according to claim 1, wherein the optical element includes:
    a first optical member that has the first measurement pattern; and
    a second optical member that has the second measurement pattern.

8. An exposure method comprising the steps of:
    calculating optical performance of a projection optical system using an exposure apparatus according to claim 1;
    adjusting the projection optical system based on the optical performance of the projection optical system, which is calculated by said calculating step; and
    exposing an object using the exposure apparatus that includes the projection optical system adjusted by said adjusting step.

9. An exposure method according to claim 8, wherein said calculating step is repeated whenever an exposure condition is changed in exposing the object.

10. A device manufacturing method comprising the steps of:
    exposing an object using an exposure apparatus according to claim 1; and
    developing the object exposed.

* * * * *